(12) United States Patent
Hamaguchi et al.

(10) Patent No.: US 10,121,957 B2
(45) Date of Patent: Nov. 6, 2018

(54) METHOD FOR MANUFACTURING A LIQUID DISCHARGING HEAD OR PORTION THEREOF

(71) Applicant: SEIKO EPSON CORPORATION, Tokyo (JP)

(72) Inventors: Toshiaki Hamaguchi, Fujimi-machi (JP); Eiju Hirai, Minowa-machi (JP); Tsuyoshi Yoda, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 370 days.

(21) Appl. No.: 14/813,478

(22) Filed: Jul. 30, 2015

(65) Prior Publication Data
US 2016/0035966 A1   Feb. 4, 2016

(30) Foreign Application Priority Data

Jul. 30, 2014   (JP) ................. 2014-154495

(51) Int. Cl.
*H01L 41/25*   (2013.01)
*H01L 41/29*   (2013.01)
(Continued)

(52) U.S. Cl.
CPC .......... *H01L 41/25* (2013.01); *B41J 2/14233* (2013.01); *B41J 2/161* (2013.01); *B41J 2/1623* (2013.01);
(Continued)

(58) Field of Classification Search
CPC .... B41J 2002/14241; B41J 2002/14491; B41J 2/14233; B41J 2/161; B41J 2/1623; B41J 2/1629
See application file for complete search history.

(56) References Cited

U.S. PATENT DOCUMENTS

| | | | |
|---|---|---|---|
| 8,087,761 B2 * | 1/2012 | Yamada | B41J 2/04506 347/68 |
| 9,242,464 B1 * | 1/2016 | Hayashi | B41J 2/14233 |

(Continued)

FOREIGN PATENT DOCUMENTS

| | | |
|---|---|---|
| JP | 2005119199 A | 5/2005 |
| JP | 2007-290232 | 11/2007 |

(Continued)

*Primary Examiner* — Minh Trinh
(74) *Attorney, Agent, or Firm* — Workman Nydegger

(57) ABSTRACT

A manufacturing method of a piezoelectric element includes forming an adhesive layer of a lead electrode on a piezoelectric element main body of a vibration plate, forming a metallic layer of the lead electrode on the adhesive layer, removing the metallic layer to leave the adhesive layer in a portion that corresponds to an extended electrode of the lead electrode using etching, patterning the remaining adhesive layer as individual extended electrodes that correspond to the piezoelectric element main body using etching, joining a protective substrate onto the vibration plate in a state in which the piezoelectric element main body is accommodated inside an accommodation hollow section and the extended electrode is positioned further on an outer side of the vibration plate than the protective substrate, layering and forming a section of the wiring on the protective substrate and the extended electrode, and patterning the wiring as individual wiring for each extended electrode using etching.

1 Claim, 9 Drawing Sheets

(51) Int. Cl.
  H01L 41/047   (2006.01)
  H01L 41/08    (2006.01)
  H01L 41/09    (2006.01)
  H01L 41/312   (2013.01)
  H01L 41/319   (2013.01)
  B41J 2/14     (2006.01)
  B41J 2/16     (2006.01)
(52) U.S. Cl.
  CPC ........... *B41J 2/1629* (2013.01); *B41J 2/1646* (2013.01); *H01L 41/0475* (2013.01); *H01L 41/0815* (2013.01); *H01L 41/0973* (2013.01); *H01L 41/29* (2013.01); *H01L 41/312* (2013.01); *H01L 41/319* (2013.01); *B41J 2002/14241* (2013.01); *B41J 2002/14491* (2013.01)

(56) References Cited

U.S. PATENT DOCUMENTS

2015/0097898 A1* 4/2015 Hayashi ............... B41J 2/14233
                                                347/71
2016/0167382 A1* 6/2016 Date .................... B41J 2/04541
                                                347/44

FOREIGN PATENT DOCUMENTS

| JP | 2008302685 A | 12/2008 |
| JP | 5082285 B    | 11/2012 |

* cited by examiner

METHOD FOR MANUFACTURING A LIQUID DISCHARGING HEAD OR PORTION THEREOF

CROSS-REFERENCE TO RELATED APPLICATIONS

The entire disclosure of Japanese Patent Application No: 2014-154495, filed Jul. 30, 2014 is expressly incorporated by reference herein in its entirety.

BACKGROUND

1. Technical Field

The present invention relates to a manufacturing method of a piezoelectric element, a manufacturing method of a liquid discharging head, and a manufacturing method of a liquid discharging apparatus, and relates to a manufacturing method of a piezoelectric element which includes electrode layers that form a pair and a piezoelectric body layer, and which deforms due to the application of a voltage to both electrode layers, a manufacturing method of a liquid discharging head, and a manufacturing method of a liquid discharging apparatus.

2. Related Art

A liquid discharging apparatus is an apparatus which is provided with a liquid discharging head, and which discharges various liquids from a discharging head. An image recording apparatus such as an ink jet type printer or an ink jet type plotter is an example of a liquid discharging apparatus, but in recent years, liquid discharging apparatuses have been applied to various manufacturing apparatuses to make use of the feature of being, able to accurately land a very small quantity of liquid onto a predetermined position. For example, liquid discharging apparatuses have been applied to display manufacturing apparatuses that manufacture color filters such as liquid crystal displays, electrode formation apparatuses that form electrodes such as organic Electro Luminescence (EL) displays and Field Emitting Displays (FEDs), and chip manufacturing apparatuses that manufacture biochips (biochemical elements). Further, liquid ink is discharged in recording heads for image recording apparatuses, and solutions of each color material of Red (R), Green (G), and blue (B) are discharged in color material discharging heads for display manufacturing apparatuses. In addition, liquid electrode materials are discharged in electrode material discharging heads for electrode formation apparatuses, and solutions of living organic material are discharged in living organic material discharging heads for chip manufacturing apparatuses.

The abovementioned liquid discharging head is provided with a piezoelectric element (an actuator) that brings about pressure fluctuations in a plurality of nozzles, a pressure chamber that is formed for each nozzle, and a liquid inside each pressure chamber. Further, the liquid discharging head is configured to bring about pressure fluctuations (or in other words, pressure changes) in a liquid inside the pressure chambers by supplying a driving signal to the piezoelectric element from a driving IC or the like through wiring, and discharge the liquid from the nozzles using the pressure fluctuations. A liquid discharging head (for example, refer to Japanese Patent No. 5082285) that is provided with a substrate, which has a function of protecting the piezoelectric element from moisture and external forces, is an example of this type of liquid discharging head. That is, the liquid discharging head in Japanese Patent No. 5082285 is configured so that the piezoelectric element is sealed and protected by a sealing section in which a space (a piezoelectric element retention unit), in which the majority of the piezoelectric element is stored, is formed on the inside of the piezoelectric element. Further, the driving IC, which is related to the driving of the piezoelectric element, is disposed on an upper surface of the sealing section. By configuring in this manner, since a space-saving is achieved in a disposition region of the driving IC, the configuration contributes to miniaturization of the liquid discharging head. Further, the driving IC, and a lead electrode of the piezoelectric element that extends to an outer side of the sealing section are electrically connected through wiring that is formed on the surface of the sealing section.

In this instance, FIG. 11 is a sectional view of a short side direction (a wiring width direction) that describes a joining portion between a lead electrode 65 of the piezoelectric element, and wiring 66 from the driving IC in a configuration of the related art. The lead electrode 65 of the piezoelectric element has a layered structure of an adhesive layer 60 (for example, nickel chrome (NiCr), titanium-tungsten (TiW) or the like), and a metallic layer 61 (for example, gold (Au), copper (Cu) or the like). A adhesive layer 60 in the lower layer is a portion that functions as a foundation for securing adhesiveness of the metallic layer 61 with respect to a formation site. The adhesive layer 60 is also conductive, and functions as a section of an electrode material. In the same manner, the wiring 66 that extends from the driving IC has a layered structure of a lower layer wiring adhesive layer 62, and an upper layer wiring adhesive layer 63, and is formed by being layered onto the lead electrode 65 of the piezoelectric element at the joining portion. While the thickness of each of these layers is made thicker in order to reduce electrical resistance, there is a demand for finer patterns. In this configuration, film formation by a plating method using a catalyst layer is not suitable for miniaturization since the film formation is performed isotropically on the side surfaces of the catalyst layer. In contrast to this, according to a manufacturing method that employs film formation using a sputtering method, and patterning using wet etching, it is even possible to form a fine pattern while making the layers thicker.

Given that, in the second of the two manufacturing methods, when the lead electrode 65 of the piezoelectric element is formed, side etching (portions shown by SE in the drawing) is generated in the metallic layer 61 in a process that performs patterning the metallic layer 61, and a process that performs patterning the adhesive layer 60. Furthermore, after the lead electrode 65 of the piezoelectric element has been formed, the side etching SE of the metallic layer 61 of the lead electrode 65 advances further in processes that respectively layer the lower layer wiring adhesive layer 62 and the upper layer wiring adhesive layer. 63 of the wiring 66 on the lead electrode 65 and pattern the lower layer wiring adhesive layer 62 and the upper layer wiring adhesive layer 63. As a result of this, there is a concern that there will be a tendency for the metallic layer 61 to peel away from the adhesive layer 60 due to a joining area of the metallic layer 61 with respect to the adhesive layer 60 being reduced, and therefore, that it will be difficult to secure conductivity.

SUMMARY

An advantage of some aspects of the invention is to provide a manufacturing method of a piezoelectric element, a manufacturing method of a liquid discharging head, and a manufacturing method of a liquid discharging apparatus that are capable of securing conductivity in a wiring connection portion, and improving reliability.

According to an aspect of the invention, there is provided a manufacturing method of a piezoelectric element in which a piezoelectric element main body, which is formed from electrode layers that form a pair, and a piezoelectric body layer, is formed on a support body and accommodated inside an accommodation hollow section inside a protective substrate that is laminated onto the support body, a lead electrode that is electrically connected to the electrode layer of the piezoelectric element main body extends from the inside of the accommodation hollow section to the support body that is further on an outer side than the protective substrate as an extended electrode, and wiring that is electrically connected no a driving circuit, which is disposed on the protective substrate, is electrically connected to the extended electrode, the manufacturing method including forming a first electrode layer of the lead electrode on the support body and the piezoelectric element main body that is on the support body, forming a second electrode layer of the lead electrode on the first electrode layer, removing the second electrode layer to leave the first electrode layer in a portion that corresponds to the extended electrode using etching, patterning the first electrode layer as individual extended electrodes that correspond to the piezoelectric element main body using etching, joining the protective substrate onto the support body in a state in which the piezoelectric element main body is accommodated inside the accommodation hollow section and the extended electrode is positioned further on an outer side of the support body than the protective substrate, layering and forming a section of the wiring on the protective substrate and the first electrode layer as the extended electrode that is further on an outer side than the protective substrate, and patterning the wiring as individual wiring for each extended electrode using etching.

According to this configuration, since the first electrode layer is removed in a portion that corresponds to the extended electrode, defects that are caused by side etching of the first electrode layer do not occur. Therefore, conduction between the lead electrode and the wiring is more reliable, and defects such as connection failures are suppressed. As a result of this, an improvement is made in the reliability of the piezoelectric element.

In the abovementioned configuration, it is desirable that the layering and forming of the section includes forming a first wiring layer of the wiring on the first electrode layer and forming a second wiring layer of the wiring on the first wiring layer.

In addition, according to another aspect of the invention, there is provided a manufacturing method of a liquid discharging head that is provided with a piezoelectric element in which a piezoelectric element main body, which is formed from electrode layers that form a pair, and a piezoelectric body layer, is formed on a vibration plate that partitions a section of pressure chambers and accommodated inside an accommodation hollow section inside a protective substrate that is laminated onto the vibration plate, a lead electrode that is electrically connected to the electrode layer of the piezoelectric element main body extends from the inside of the accommodation hollow section to the vibration plate that is on an outer side of the protective substrate as an extended electrode, and wiring that is electrically connected to a driving circuit, which is disposed on the protective substrate, is electrically connected to the extended electrode, the manufacturing method including forming a first electrode layer of the lead electrode on the vibration plate and the piezoelectric element main body that is on the vibration plate, forming a second electrode layer of the lead electrode on the first electrode layer, removing the second electrode layer to leave the first electrode layer in a portion that corresponds to the extended electrode using etching, patterning the first electrode layer as individual extended electrodes that correspond to the piezoelectric element main body using etching, joining the protective substrate onto the vibration plate in a state in which the piezoelectric element main body is accommodated inside the accommodation hollow section and the extended electrode is positioned further on an outer side of the vibration plate than the protective substrate, layering and forming a section of the wiring on the protective substrate and the first electrode layer as the extended electrode that is further on an outer side than the protective substrate, and patterning the wiring as individual wiring for each extended electrode using etching.

Further, according to still another aspect of the invention, there is provided a manufacturing method of a liquid discharging apparatus, which is provided with a liquid discharging head that has a piezoelectric element in which a piezoelectric element main body, which is formed from electrode layers that form a pair, and a piezoelectric body layer, is formed on a vibration plate that partitions a section of pressure chambers and accommodated inside an accommodation hollow section inside a protective substrate that is laminated onto the vibration plate, a lead electrode that is electrically connected to the electrode layer of the piezoelectric element main body extends from the inside of the accommodation hollow section to the vibration plate that is on an outer side of the protective substrate as an extended electrode, and wiring that is electrically connected to a driving circuit, which is disposed on the protective substrate, is electrically connected to the extended electrode, the manufacturing method including forming a first electrode layer of the lead electrode on the vibration plate and the piezoelectric element main body that is on the vibration plate, forming a second electrode layer of the lead electrode on the first electrode layer, removing the second electrode layer to leave the first, electrode layer in a portion that corresponds to the extended electrode, using etching, patterning the first electrode layer as individual extended, electrodes that correspond to the piezoelectric element main body using etching, joining the protective substrate onto the vibration, plate in a state in which, the piezoelectric element main body is accommodated inside the accommodation hollow section and the extended electrode is positioned further on an outer side of the vibration plate than the protective substrate, layering and forming a section of the wiring on the protective substrate and the first electrode layer as the extended electrode that is further on an outer side than the protective substrate, and patterning the wiring as individual wiring for each extended electrode using etching.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, forms for implementing the invention will be described with reference to the appended drawings. Additionally, in the embodiments that are described below, various limitations are given as preferred specific examples of the invention, but the scope of the invention is not limited to these aspects unless a feature that limits the invention is specifically stated in the following description. In addition, in the following description, an example of a case of use as an actuator for discharging ink in an ink jet type printer (hereinafter, referred to as a, printer), which is an example of a, liquid discharging apparatus, in which an ink jet type recording head (hereinafter, referred to as a recording head), which is an example of a liquid discharging head, is equipped, is given as an example of a piezoelectric element according to the invention.

Figure 1:
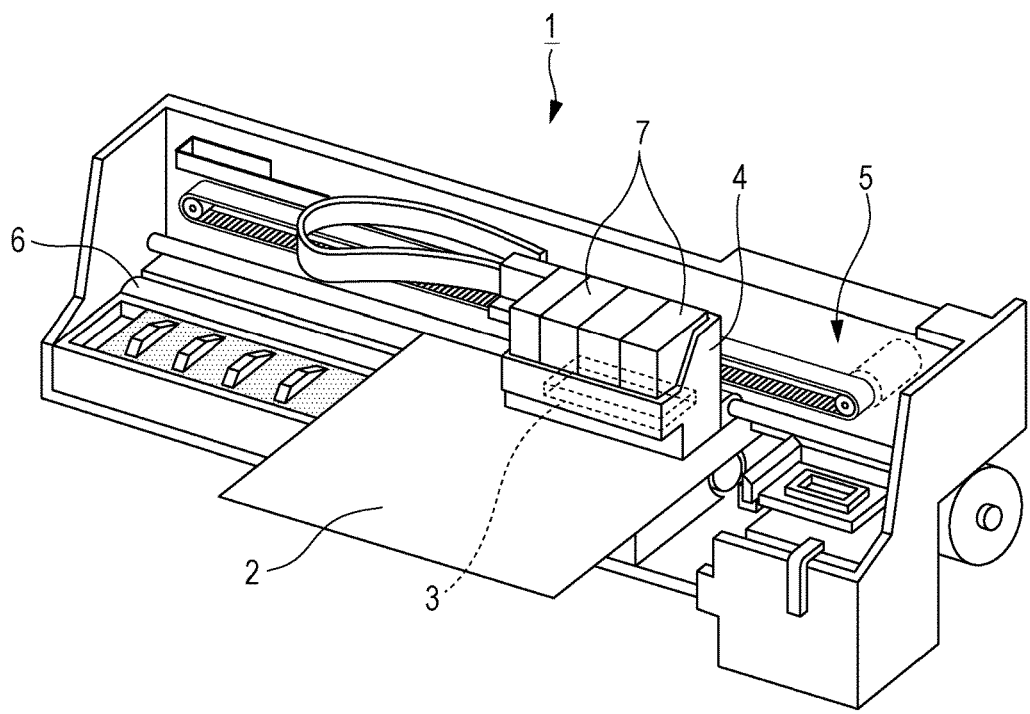
FIG. 1 is a perspective view that describes a configuration of a printer.

A configuration of a printer 1 will be described with reference to FIG. 1. The printer 1 is an apparatus that performs the recording of images or the like by discharging ink onto a surface of a recording medium 2 such as recording paper. The printer 1 is provided with a recording head 3, a carriage 4 to which the recording head 3 is attached, a carriage movement mechanism 5 that moves the carriage 4 in a main scanning direction, and a transport mechanism 6 that transfers the recording medium 2 in a sub-scanning direction. In this instance, the abovementioned ink is stored in ink cartridges 7 as liquid supply sources. The ink cartridges 7 are removably mounted in the recording, head 3. Additionally, it is possible to adopt a configuration in which the ink cartridges are disposed on a main body side of the printer, and ink is supplied to the recording head from the ink cartridges through an ink supply tube.

Figure 2:
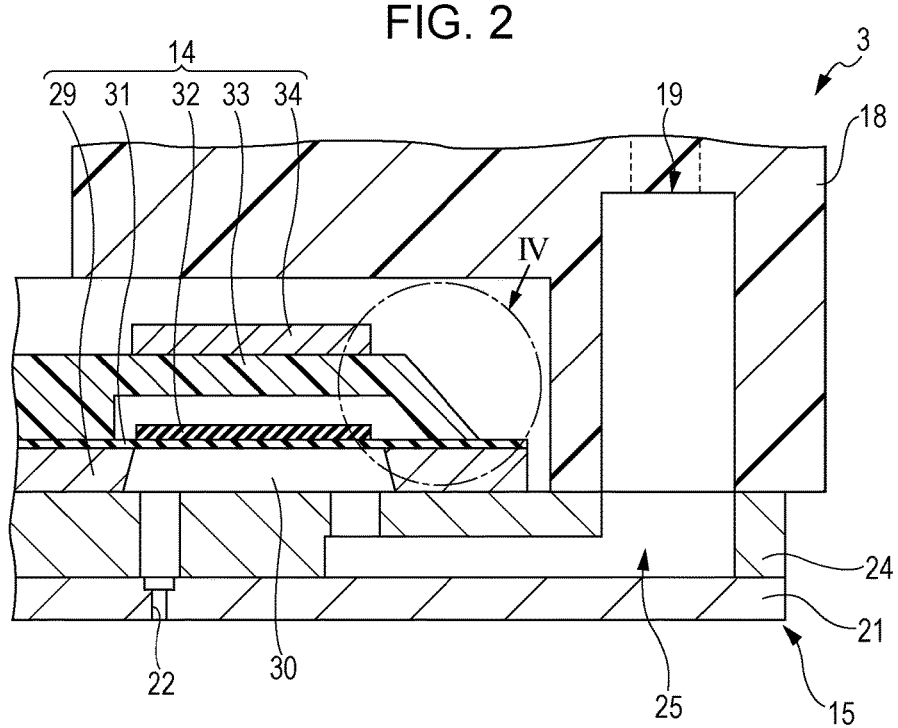
FIG. 2 is a main part sectional view that describes a configuration of a recording head.
Figure 3:
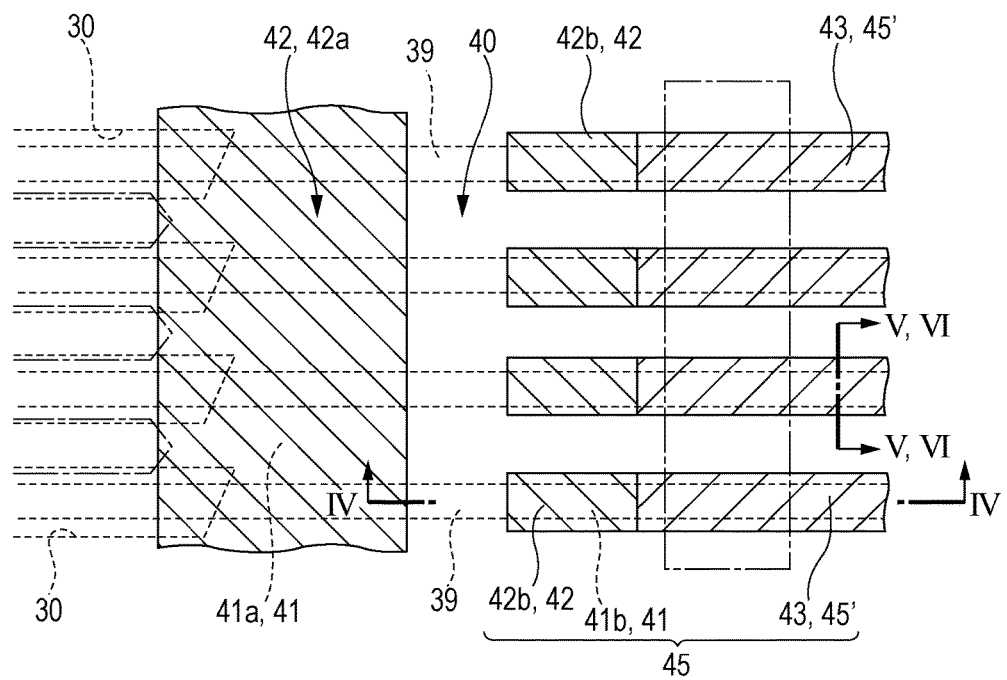
FIG. 3 is a plan view that mainly describes a configuration of the vicinity of a lead electrode of a piezoelectric element on a vibration plate.
Figure 4:
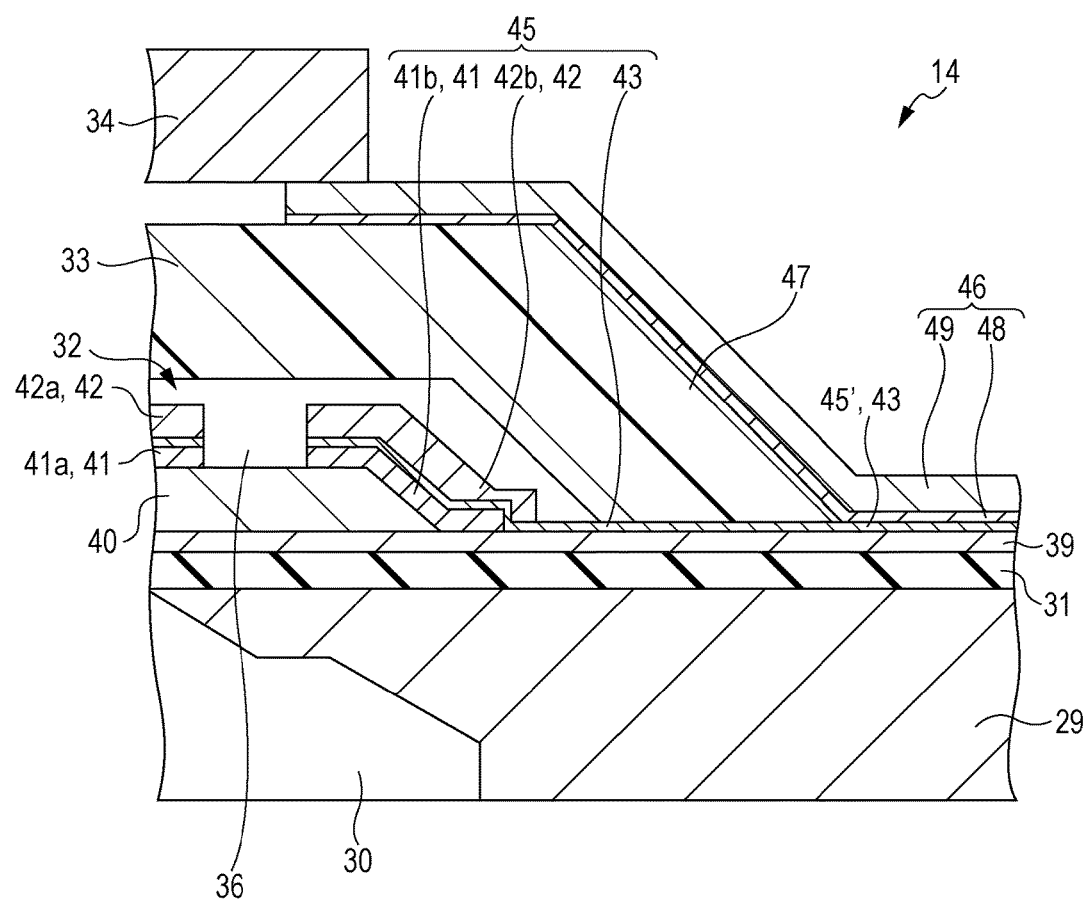
FIG. 4 is an enlarged view that shows a region IV in FIG. 2.

FIG. 2 is a main part sectional view that shows a configuration of the recording head 3 of the present, embodiment. In addition, FIG. 3 is a plan view that mainly describes a configuration of the vicinity of a lead electrode 45 of a piezoelectric element 32 on a vibration plate 21. Furthermore, FIG. 4 is an enlarged view of a region IV in FIG. 2, and is a sectional view taken along a line IV-IV in FIG. 3. Additionally, FIG. 3 illustrates a portion that corresponds to an end in a longitudinal direction of a pressure chamber 22 (a direction that intersects a nozzle row direction). The recording head 3 in the embodiment is provided with a pressure generation unit 14 and a flow channel unit 15, and is configured to be attached to a case 18 in a state in which the abovementioned members are laminated together.

The case 18 is a synthetic resin box-shaped member, and an ink introduction path 19 is formed therein. The flow channel unit 15 includes a nozzle plate 21 in which a plurality of nozzles 22 are provided in a linear manner, and a communication substrate 24 in which a liquid supply flow channel 25 is formed. A plurality of lined up nozzles 22 (nozzle rows) is provided along the sub-scanning direction, which intersects the main scanning direction, at a pitch (for example, 180 dpi) that corresponds to a dot formation density from one end side of the nozzles 22 to the other end side of the nozzles 22.

The pressure generation unit 14 is unitized by laminating a pressure chamber formation substrate 29 on which a pressure chamber 30 is formed, a vibration plate 31, the piezoelectric element 32, a protective substrate 33, and a driving IC 34. The pressure chamber formation substrate 29 is formed from a monocrystalline silicon substrate, and a plurality of pressure chambers 30 are formed to correspond to each nozzle 22 of the nozzle plate 21. The pressure chambers 30 are air sections that are longitudinal in a direction that is orthogonal to the nozzle row direction. As shown in FIG. 4, the vibration plate 31 is formed on an upper surface (a surface that is on a side that is opposite to a joining surface with the communication substrate 24) of the pressure chamber formation substrate 29 in a state that seals upper section openings of the pressure chambers 30. The vibration plate 31 is, for example, formed from an elastic film that is formed from silicon dioxide ($SiO_2$) formed on an upper surface of the pressure chamber formation substrate 29, and an insulating body film that is formed from zirconium oxide ($ZrO_2$) formed on the elastic film. Further, piezoelectric elements 32 are respectively formed on the insulating film (the vibration plate 31) in positions that correspond to each pressure chamber 30.

The piezoelectric elements 32 of the present embodiment, are so-called deflection mode piezoelectric elements. In the piezoelectric elements 32, a lower electrode layer 39, a piezoelectric body layer 40, and an upper electrode layer 41 are sequentially laminated onto the vibration plate 31 (corresponding to the support, body of the invention). In the present embodiment, while the lower electrode layer 39 is provided individually for each separate pressure chamber 30, the upper electrode layer 41 is provided continuously across a plurality of pressure chambers 30. Therefore, the lower electrode layer 39 serves as individual electrodes for each pressure chamber 30, and the upper electrode layer 41 serves as a common electrode that is shared by each pressure chamber 30. Additionally, as shown in FIG. 4, in the end section of the piezoelectric elements 32, an upper electrode layer 41b, which is electrically connected to the lower electrode layer 39, and is a section of the lead electrode 45, is separated from an upper electrode layer 41a that is serves as the common electrode using patterning, and is formed individually to correspond to each lower electrode layer 39. Further, a region in which the piezoelectric body layer 40 is interposed between the lower electrode layer 39 and the upper electrode, layer 41a, which form a pair, forms an active section in which piezoelectric distortions are generated due to the application of a voltage to both, electrodes. Additionally, it is possible to set the lower electrode layer as a common electrode by forming the lower electrode layer continuously across a plurality of pressure chambers, and it is possible to set the upper electrode layer as an individual electrode by providing the upper electrode layer individually for each separate pressure chamber.

In addition, in the piezoelectric element 32 of the present embodiment, a portion in which the piezoelectric body layer 40 is interposed between the lower electrode layer 39 and the upper electrode layer 41, which form a pair, and which is accommodated inside an accommodation hollow section 36 of the protective substrate 33, which will be described later, corresponds to the piezoelectric element main body of the invention.

A metallic layer 42 is formed on the upper electrode layer 41 through an adhesive layer 43. The metallic layer 42 includes two sites of a spindle section 42a and a lead electrode layer 42b. The spindle section 42a is above the upper electrode layer 41a that serves as the common electrode, and is formed in an end section region of the active section of the piezoelectric element 32. As a result of this, it is possible to improve the rigidity of the end section region of the active section at which there is a tendency for stress to be concentrated, and therefore, it is possible to suppress the occurrence of damage such as cracking in the piezoelectric element 32. The lead electrode layer 42b and the adhesive layer 43 are patterned to correspond to each lower electrode layer 39, which are individual electrodes in the same manner as the upper electrode layer 41b, and are respectively electrically connected to the corresponding lower electrode layer 39. In the present embodiment, the lead electrode 45 is configured by the upper electrode layer 41b, the adhesive layer 43 (corresponding to the first electrode layer of the present invention), and the lead electrode layer 42b (corresponding to the second electrode layer of the invention). Additionally, an upper surface at an end section of the piezoelectric body layer 40 is inclined downward toward a lower electrode layer 39 side, and the lead electrode layer 42b, the adhesive layer 43, and the upper electrode layer 41b extend along the inclined surface to above the lower electrode layer 39 on an outer side of the piezoelectric body layer 40. Among the lead electrode layer 42b, the adhesive layer 43, and the upper electrode layer 41b, the lead electrode layer 42b and the upper electrode layer 41b are formed inside the accommodation hollow section 36, which will be described later. In contrast to this along with the lower electrode layer 39, the adhesive layer 43 is formed on the vibration plate 31 up to an outer side of the protective substrate 33 by extending further to an outer side in a longitudinal direction of the pressure chamber 30 than end sections of the upper electrode layer 41b and the lead electrode layer 42b.

Additionally, various metals such as iridium (Ir), platinum (Pt), titanium (Ti), tungsten (W), tantalum (Ta), molybdenum (Mo), or alloys or the like of these metals can be used as the upper electrode layer 41 and the lower electrode layer 39. LaNiO$_3$ or the like can be given as an example of an alloy electrode. In addition, a ferroelectric piezoelectric material such as lead zirconate titanate (PZT), or a relaxer ferroelectric in which metals such as niobium, nickel, magnesium, bismuth and yttrium have been added to the ferroelectric piezoelectric material can be used as the piezoelectric body layer 40. In addition to this, it is possible to use a lead-free material such as barium titanate. Furthermore, gold (Au), copper (Cu) or the like, can be used as the metallic layer 42 (the spindle section 42a and the lead electrode layer 42b), and titanium, nickel, chromium, or alloys or the like of these metals can be used as the adhesive layer 43. The adhesive layer 43 of the lead electrode 45 in the present embodiment is manufactured from nickel chromium (NiCr), and the metallic layer 42 (the spindle section 42a and the lead electrode layer 42b) is manufactured from gold (Au). Further, the adhesive layer 43 is also conductive, and functions as a section of an electrode material.

The protective substrate 33, which, has the accommodation hollow section 36 that is capable of accommodating the piezoelectric, element 32, is joined to the vibration plate 31, on which, each layer that configures the piezoelectric element 32 and the lead electrode 45 is laminated, using an adhesive or the like. The protective substrate 33 is a box-shaped member in which a lower surface (a surface of a vibration plate 31 side) is open, and is manufactured using a silicon, substrate, a synthetic resin or the like. The accommodation hollow section 36 that is inside the protective substrate 33 is a cavity that is formed, from a lower surface side of the protective substrate 33 to midway along a height direction of the protective substrate 33 toward an upper surface side (a case 18 side). In the protective substrate 33, a lower end surface of a, side wall 47 that partitions the accommodation hollow section 36 is joined (indirectly) to the vibration plate 31 through, the lower electrode layer 39, the adhesive layer 43 and the like using an adhesive or the like in a state in which the majority of the piezoelectric element 32 (that is, the piezoelectric element main body) is accommodated inside the accommodation hollow section 36. Additionally, a region in FIG. 3 that is surrounded by a dashed-dotted line is a, portion, to which the side wall 47 of the protective substrate 33 is joined. Further, the adhesive layer 43 that extends from a piezoelectric element main body side to a side (the right side in the drawing) that is opposite to the piezoelectric element main body side with this portion interposed therebetween is an extended electrode 45' that corresponds to each piezoelectric element 32.

The driving IC 34, which is related to driving of the piezoelectric element 32, is attached to an upper surface of the protective substrate 33 of the present embodiment. The driving IC 34 is provided with a plurality of individual terminals, which are not shown in the drawing, and are electrically connected to individual electrodes. Each terminal of the driving IC 34 is respectively electrically connected to the extended electrode 45' of the lead electrode 45, which extends on the lower electrode layer 39, in a region on the vibration plate 31 that is further on an outer side than the protective substrate 33, through wiring 46 that is formed on the surface of the protective substrate 33. The wiring 46 is configured by a wiring adhesive layer 48 (corresponding to the first wiring layer of the invention) for securing adhesiveness with respect to the protective substrate 33, and a wiring metallic layer 49 (corresponding to the second wiring layer of the invention), which is a metallic layer. In the present embodiment, the wiring adhesive layer 48 is manufactured from titanium-tungsten (TiW), and the wiring metallic layer 49 is manufactured from gold (Au). The wiring adhesive layer 48 is also conductive, and functions as a section of a wiring material. An upper surface of the protective substrate 33 of the present embodiment is inclined downward from a surface on which the driving IC 34 is mounted toward an upper surface of the vibration plate 31 at an end section of a lead electrode 45 side. Further, the wiring 46 is formed from a region in which a terminal of one side (the inclined surface side) of the driving IC 34, which is the upper surface of the protective substrate 33, across the inclined surface and a region on the vibration plate 31 in which the adhesive layer 43 of the lead electrode 45 is formed. A terminal of the driving IC 34 and a corresponding extended electrode 45' of the adhesive layer 43 of the lead electrode 45 are electrically connected by the wiring 46. Additionally, the connection portion between the wiring 46 and the lead electrode 45 will be described in detail later.

Further, the recording head 3 drives the piezoelectric elements 32 and generates pressure fluctuations in the pressure chambers 30 by introducing ink from the ink cartridges 7 into the pressure chambers 30 via the ink introduction path 19 and the liquid supply flow channel 25, and applying a driving signal (a driving voltage) to the piezoelectric elements 32 from a control unit via the driving IC 34. Ink droplets are discharged from the nozzles 22 by using the pressure fluctuations.

In this instance, in recording heads of the related art, the adhesive layer and the metallic layer that configure the lead electrode of the piezoelectric element both extend up to a position on the vibration plate that corresponds to an outer side of the protective substrate, and wiring is connected to the extended portion from the driving IC. However, a problem arises in that side etching (also referred to as undercutting) occurs in the metallic layer of the lead electrode in processes that sequentially layer and form the wiring adhesive layer and the wiring metallic layer on the extended portion of the lead electrode, and therefore, there is a tendency for the metallic layer to peel away from the adhesive layer. In contrast to this, in the present embodiment, by devising a process that forms the lead electrode 45 and the wiring 46, the abovementioned problem is resolved. This point will be described below.

Firstly, a manufacturing method will be described as a first comparative example.

Figure 5A:
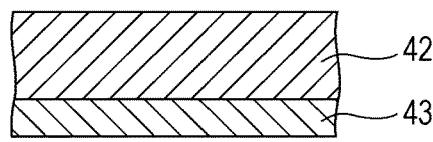
FIGS. 5A to 5E are process views that describe a manufacturing method in a first comparative example.
Figure 5B:
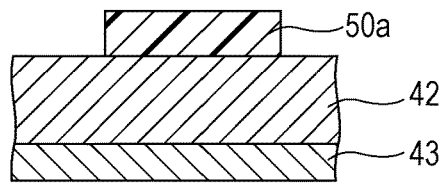

FIGS. 5A to 5B are views that describe a process that forms the lead electrode 45 and the wiring 46 with the manufacturing method of the first comparative example, and are sectional views (corresponding to sectional views taken along lines and VI-VI in FIG. 3) wiring width direction at a connection portion (that is, a portion that corresponds to the extended electrode 45' of the lead electrode 45) between the lead electrode 45 and the wiring 46. Additionally, in these drawings, the illustration of other members such as the vibration plate 31, the lower electrode layer 39 and the protective substrate 33 has been omitted. In addition, the following processes are performed after a main body portion (the lower electrode layer 39, the piezoelectric body layer 40 and the upper electrode layer 41) of the piezoelectric element 32 has been formed on the vibration plate 31 (the same applies to other manufacturing methods that will be described later).

Figure 5C:
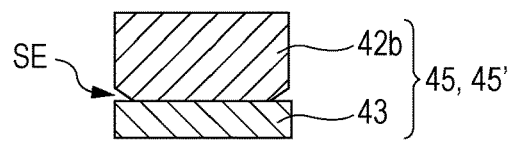

Firstly, as shown in FIG. 5A, the adhesive layer 43 (for example, a NiCr layer. The same applies to manufacturing method that will be described later.), and the metallic layer 42 (for example, an Au layer. The same applies to manufacturing method that will be described later) of the lead electrode 45 are sequentially formed. In films on the vibration plate 31, on which the main body portion of the piezoelectric element 32 has been formed. In this instance, the adhesive layer 43 and the metallic layer 42 are formed by being layered on the lower electrode layer 39, which is formed on the vibration plate 31, in a portion that corresponds to the extended electrode 45' of the lead electrode 45. Subsequently, as shown in FIG. 5B, a resist layer 50a is formed on the metallic layer 42 as a result of undergoing the application of a resist, exposure through a first mask and developing. The first mask is a mask for patterning the metallic layer 42 into the spindle section 42a, the lead electrode layer 42b and the like. Further, as shown in FIG. 5C, the metallic layer 42 and the adhesive layer 43 are patterned by performing a wet etching treatment (hereinafter, referred to as an etching treatment) using an etching liquid (hereinafter, referred to as a first etching liquid) such as a liquid that includes potassium iodide (alternatively, an aqua regia based liquid or an NaCN based liquid can be used) on the metallic layer 42, and an etching liquid (hereinafter, referred to as a second etching liquid) that includes ceric ammonium nitrate on the adhesive layer 43 (the drawing shows a state after the removal of the resist layer 50a. Hereinafter, description of the removal of resist layers will be omitted). In the first comparative example, the extended electrode 45' of the lead electrode 45 is configured by the adhesive layer 43 and the lead electrode layer 42b. In the process of the etching, side etching SE is caused in the metallic layer 42. The lead electrode 45 is formed by undergoing the abovementioned processes. Additionally, although not shown in the drawings, there are portions in which the adhesive layer 43 is exposed, and therefore patterning of the lead electrode layer 42b is subsequently performed using a second mask.

Figure 5D:
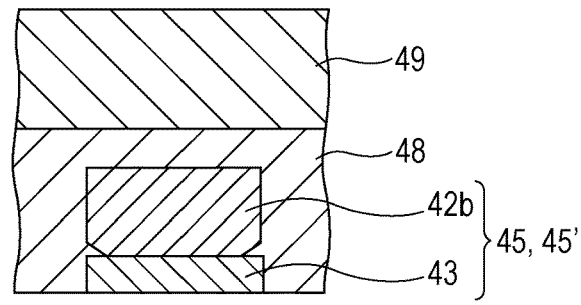
Figure 5E:
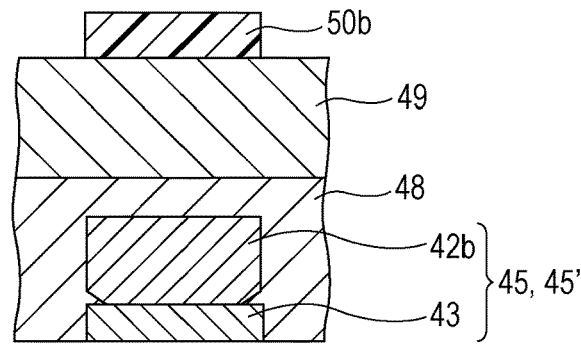
Figure 6A:
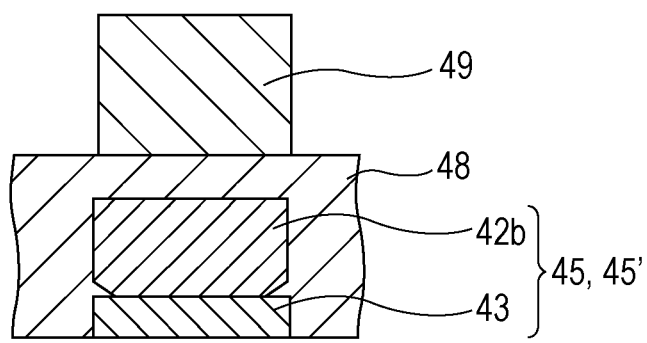
FIGS. 6A and 6B are process views that describe the manufacturing method in the first comparative example.
Figure 6B:
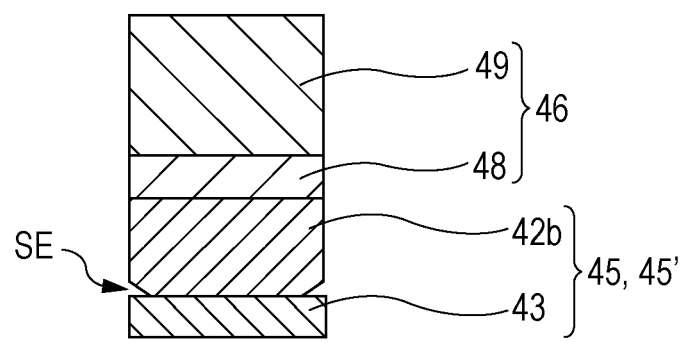

Next, a lower end surface of the side wall 47 is joined to the vibration plate 31, on which the piezoelectric element main body and the lead electrode 45 are formed, using an adhesive or the like, in a state in which the piezoelectric element main body is accommodated inside the accommodation hollow section 36, and the extended electrode of the lead electrode 45 extends further on an outer side of the vibration plate 31 than the protective substrate 33. Thereafter, the process proceeds to a process that forms the wiring 46 that connects each terminal of the driving IC 34 that is attached to the protective substrate 33, and each corresponding lead electrode 45. More specifically, as shown in FIG. 5D, firstly, the wiring adhesive layer 48 (for example, a TiW layer. The same applies to manufacturing methods that will be described later) and the wiring metallic layer 49 (for example, an Au layer. The same applies to manufacturing methods that will be described later) are sequentially formed in films on the vibration plate 31 at the surface of the protective substrate 33 and in a region that is on an outer side of the protective substrate 33 using a sputtering method. Next, as shown in FIG. 5E, a resist layer 50b is formed on the wiring metallic layer 49 using a mask (a third mask) depending on a wiring shape. Further, as shown in FIG. 6A, the wiring metallic layer 49 is patterned through an etching treatment that uses the first etching liquid. Next, as shown in FIG. 6B, the wiring adhesive layer 48 is patterned through an etching treatment with an etching liquid (hereinafter, referred to as a third etching liquid) that includes a hydrogen peroxide solution, for example, with the wiring metallic layer 49 after patterning set as a mask. The wiring 46 is formed by the abovementioned processes, and the extended electrode 45' of the lead electrode 45 and the wiring 46 are electrically connected through the wiring 46 being laminated on the extended electrode 45'. In the first comparative example, side etching SE arises in the metallic layer 42 in processes that perform patterning of the metallic layer 42 and the adhesive layer 43, but by setting the patterning of the wiring metallic layer 49 and the patterning of the wiring adhesive layer 48 as separate processes, the advance of the side etching SE of the lead electrode layer 42b during patterning of the wiring metallic layer 49 is prevented.

Next, a manufacturing method will be described as a second comparative example.

FIGS. 7A to 8C are views that describe a process that forms the lead electrode 45 and the wiring 46 with the manufacturing method of the second comparative example.

Figure 7A:
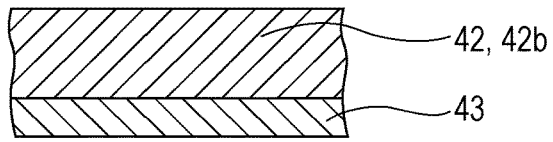
FIGS. 7A to 7F are process views that describe a manufacturing method in a second comparative example.
Figure 7B:
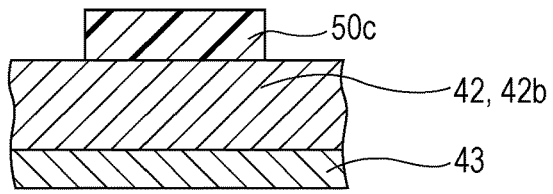
Figure 7C:
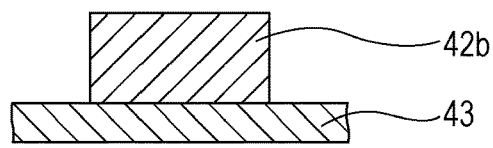
Figure 7D:
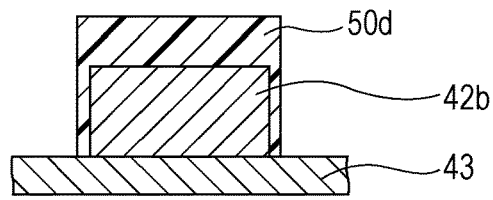
Figure 7E:
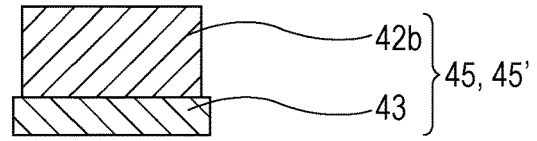

Firstly, as shown in FIG. 7A, the adhesive layer 43 and the metallic layer 42 of the lead electrode 45 are sequentially formed in films on the vibration plate 31, on which the main body portion of the piezoelectric element 32 has been formed. Next, as shown in FIG. 7B, a resist layer 50c is formed on the metallic layer 42 using the first mask. Further, as shown in FIG. 7C, the metallic layer 42 is patterned by performing an etching treatment using the first etching liquid, and the lead electrode layer 42b is formed in a portion that corresponds to the extended electrode 45'. Next, as shown in FIG. 7D, a first' mask, in which a width of an aperture that corresponds to the lead electrode 45 is slightly wider than that of the first mask, is used, and a resist layer 50d that covers the upper surface and side surfaces of the lead electrode layer 42b after patterning is formed. Next, as shown in FIG. 7E, the adhesive layer 43 is patterned with an etching treatment using the second etching liquid. At this time, since the side surfaces of the lead electrode layer 42b are covered by the resist layer 50b, the generation of side etching in the lead electrode layer 42b is suppressed. In the second comparative example, the extended electrode 45' of the lead electrode 45 is configured by the adhesive layer 43 and the lead electrode layer 42b. Subsequently, patterning is performed using the second mask since for exposing the adhesive layer 43 in a portion that does not appear in the drawings.

Figure 7F:
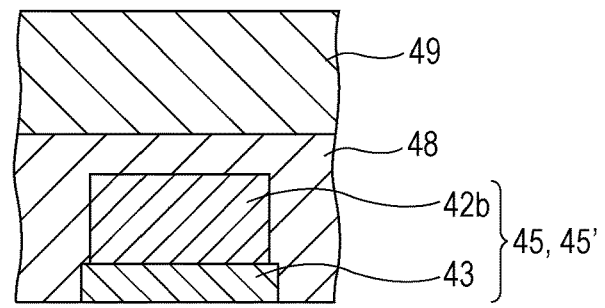
Figure 8A:
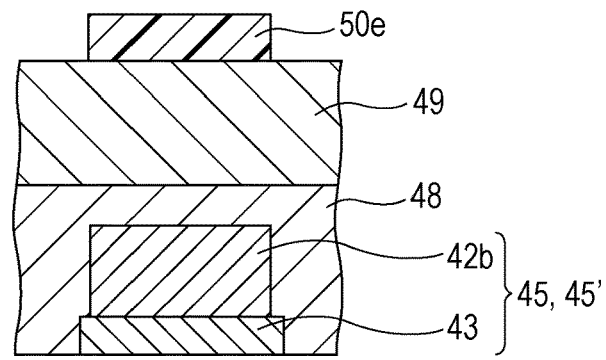
FIGS. 8A to 8C are process views that describe the manufacturing method in the second, comparative example.
Figure 8B:
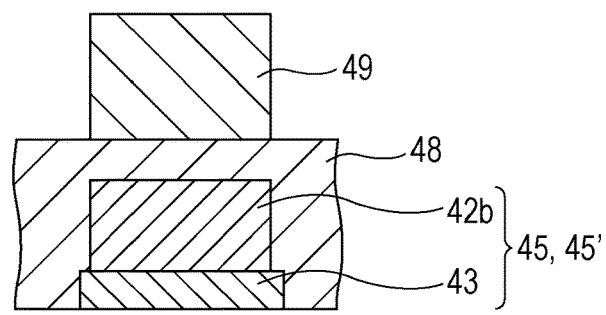
Figure 8C:
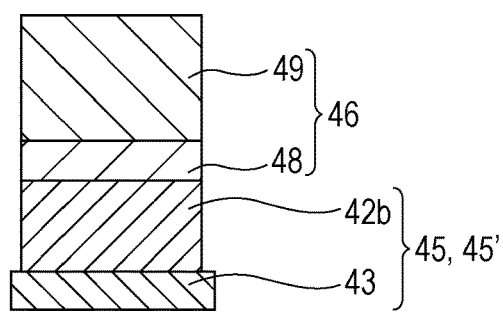

Next, a lower end surface of the side wall 47 is joined onto the vibration plate 31 using an adhesive or the like, in a state in which the piezoelectric element main body is accommodated inside the accommodation hollow section 36, and the extended electrode 45' of the lead electrode 45 extends further on an outer side of the vibration plate 31 than the protective substrate 33. Next, as shown in FIG. 7F, the wiring adhesive layer 48 and the wiring metallic layer 49 are sequentially formed in films using a sputtering method. Next, as shown in FIG. 8A, a resist layer 50e is formed on the wiring metallic layer 49 using a mask (the third mask) depending on the wiring shape. Further, as shown in FIG. 8B, the wiring metallic layer 49 is patterned by performing an etching treatment using the first etching liquid. Next, as shown in FIG. 8C, the wiring adhesive layer 48 is patterned through an etching treatment with the third etching liquid with the wiring metallic layer 49 after patterning set as a mask. The wiring 46 is formed by undergoing the abovementioned processes, and the extended electrode 45' of the lead electrode 45 and the wiring 46 are electrically connected through the wiring 46 being laminated on the extended electrode 45'.

In the manufacturing method of the second comparative example, it is possible to reliably suppress side etching that occurs in the lead electrode layer 42b, but in comparison with the manufacturing method of the first comparative example, an additional mask of the first' mask is required.

Lastly, the manufacturing method according to the invention will be described.

FIGS. 9A to 10C are views that describe a process that forms the lead electrode 45 and the wiring 46 with the manufacturing method according to the invention, and in the same manner as FIGS. 5A to 8C are sectional views of a wiring width direction at a connection portion (that is, a portion that corresponds to the extended electrode 45' of the adhesive layer 43) between the lead electrode 45 and the wiring 46.

Figure 9A:
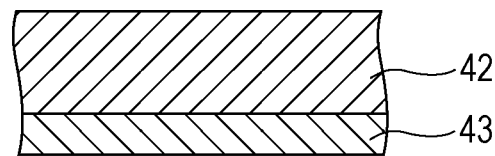
FIGS. 9A to 9E are process views, that describe a manufacturing method according to the invention.
Figure 9B:
Figure 9C:
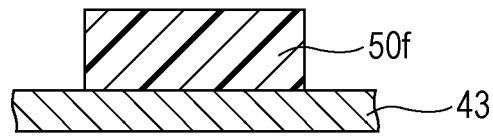
Figure 9D:

Firstly, as shown in FIG. 9A, a process (corresponding to the forming of the first electrode layer of the invention) that forms the adhesive layer 43 of the lead electrode 45 (corresponding to the first electrode layer of the invention) in a film on the vibration plate 31 on which the main body portion of the piezoelectric element 32 has been formed, and a process (corresponding to the forming of the second electrode layer of the invention) that forms the metallic layer 42 (corresponding to the second electrode layer of the invention) on the adhesive layer 48 are sequentially performed. Next, a resist layer, which is not shown in the drawing, is formed on the metallic layer 42 using a mask A, and the metallic layer 42 is patterned by performing a wet etching treatment using the first etching liquid. The mask A differs from the first mask of the abovementioned comparative examples, and is a mask that corresponds to a pattern that removes the metallic layer 42 (the lead electrode layer 42b) that corresponds to the extended electrode 45'. Therefore, in the process, as shown in FIG. 9B, the metallic layer 42 of a portion in which a lower end surface of the side wall 47 of the protective substrate 33 is joined, and a portion that corresponds to further on an outer side of the protective substrate 33 on the vibration plate 31 (including a portion that corresponds to the extended electrode 45') is removed (corresponding to the removing of the second electrode layer to leave the first electrode layer of the invention) (corresponding to the third electrode layer of the invention). Additionally, in a portion that corresponds to the lead electrode 45 that is inside the accommodation hollow section 36 of the protective substrate 33, the metallic layer 42 (the lead electrode layer 42b) is left (that is, patterned) to correspond to each lower electrode layer 39. Next, as shown in FIG. 9C, a resist layer 50f is formed on the adhesive layer 43 using a mask B. Next, as shown in FIG. 9D, the adhesive layer 43 is patterned with an etching treatment using the second etching liquid (corresponding to the patterning of the first electrode layer as individual extended electrodes of the invention). The mask B is a mask that corresponds to the first mask of the comparative examples. As a result of this, the extended electrode 45' that is formed from the adhesive layer 43 is formed on the lower electrode layer 39 in a portion that corresponds to further on an outer side of the protective substrate 13 on the vibration plate 31.

Figure 9E:
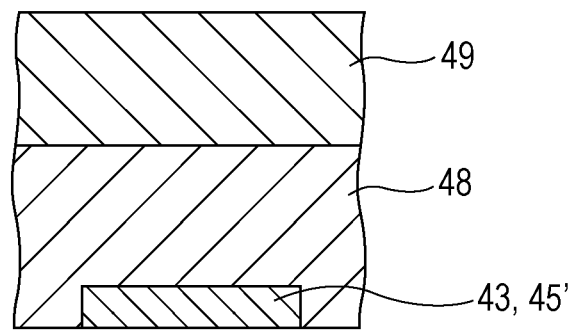
Figure 10A:
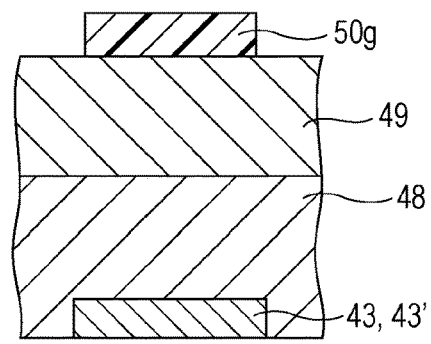
FIGS. 10A to 10C are process views that describe the manufacturing method according to the invention.
Figure 10B:
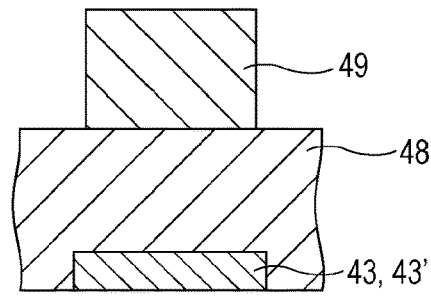
Figure 10C:
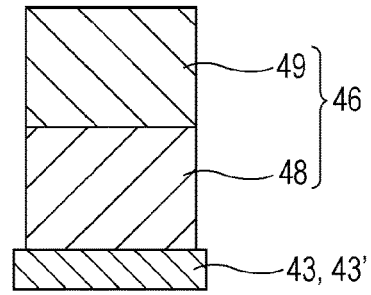
Figure 11:
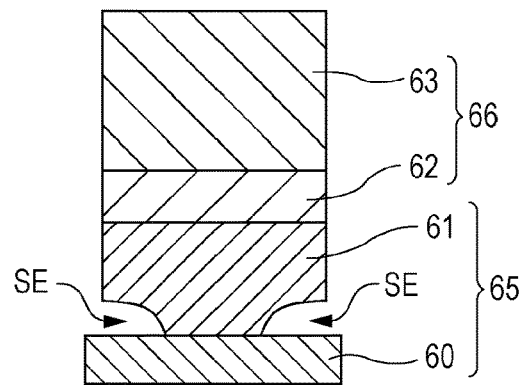
FIG. 11 is a sectional view that describes a configuration of a joining portion between wiring and an extended electrode of a lead electrode of the related art.

Next, a lower end surface of the side wall. 47 is joined onto the vibration plate 31 using an adhesive or the like, in a state in which the piezoelectric element main body is accommodated inside the accommodation hollow section 36, and the extended electrode 45' that is formed from the adhesive layer 43 only extends further on an outer side than the protective substrate 33 (corresponding to the joining of the protective substrate of the invention). Next, as shown in FIG. 9E, the wiring adhesive layer 48 (corresponding to the first wiring layer of the invention) and the wiring metallic layer 49 (corresponding to the second wiring layer of the invention) are sequentially formed in films on the vibration plate. 31 at the surface of the protective substrate 33, and in a region that is further on an outer side than the protective substrate 33 using a sputtering method (corresponding to the layering and forming of the section of the wiring of the invention). As a result of this, a portion of a layer that forms the wiring 46 overlaps on the extended electrode 45' that is formed from the adhesive layer 43. Next, as shown in FIG. 10A, a resist layer 50g is formed on the wiring metallic layer 49 using a mask C depending on a wiring shape. The mask C is a mask that corresponds to the third mask of the comparative examples. Further, as shown in FIG. 10B, the wiring metallic layer 49 is patterned by performing an etching treatment using the first etching liquid (corresponding to the patterning of the wiring). Next, as shown in FIG. 10C, the wiring adhesive layer 48 is patterned through an etching treatment with the third etching liquid with the wiring metallic layer 49 after patterning set as a mask (corresponding to the patterning of the wiring). The wiring 46 is formed by undergoing the abovementioned processes, and the extended electrode 45' that is formed from the adhesive layer 43 of the lead electrode 45 and the wiring 46 are electrically connected through the wiring 46 being laminated on the extended electrode 45'.

In the manufacturing method according to the invention, since the lead electrode layer 42b of a portion that corresponds to the extended electrode 45' is removed, defects that are caused by side etching of the lead electrode layer 42b do not occur. Therefore, conduction of the wiring 46 with the lead electrode 45 is more reliable, and defects such as connection failures are suppressed. As a result of this, it is possible to improve the reliability of the piezoelectric element 32. In addition, there are three types of masks, A to C, that are used, and in comparison with the manufacturing method of each of the abovementioned comparative examples, an increase in masks is not required.

Additionally, in the abovementioned embodiment, description was given using an ink jet type recording head that is mounted in an ink jet printer as an example of a liquid discharging apparatus according to the invention, but the invention can be app-lied to liquid ejecting heads that eject liquids other than ink. For example, it is also possible to apply the invention to liquid discharging apparatuses that are provided with color material discharging heads that are used in the production of color filters such as liquid crystal displays, electrode material discharging heads that are used in electrode formation such as organic Electro Luminescence (EL) displays, Field Emission Displays (FEDs) and the like, and living organic material discharging heads that are used in the production of biochips (biotips), and the like.

In addition, the invention is not limited to being used as an actuator in a liquid discharging head or a liquid discharging apparatus, and for example, can also be applied to piezoelectric elements that are used in various sensors and the like.

What is claimed is:

1. A method for manufacturing a portion of a liquid discharging head, the method comprising:
   forming a first electrode layer of a lead electrode on a vibration plate and a piezoelectric element main body that is on the vibration plate;
   forming a second electrode layer of the lead electrode on the first electrode layer;
   etching the second electrode layer to remove at least a portion of the second electrode layer to leave the first electrode layer in a portion that corresponds to an extended electrode;
   etching the first electrode layer to pattern the first electrode layer as individual extended electrodes that correspond to a piezoelectric element main body;
   joining a protective substrate onto the vibration plate in a state in which the piezoelectric element main body is accommodated inside an accommodation hollow section and the extended electrode is positioned further on an outer side of the vibration plate than the protective substrate;
   layering and forming a section of the wiring on the protective substrate and the first electrode layer as the extended electrode that is further on an outer side than the protective substrate; and
   etching the wiring to pattern the wiring as individual wiring for each of the individual extended electrodes.

* * * * *